United States Patent
Krishnan et al.

(10) Patent No.: US 7,471,536 B2
(45) Date of Patent: Dec. 30, 2008

(54) MATCH MISMATCH EMULATION SCHEME FOR AN ADDRESSED LOCATION IN A CAM

(75) Inventors: Rengarajan S Krishnan, Karnataka (IN); Rashmi Sachan, Karnataka (IN); Bryan D Sheffield, McKinney, TX (US); Nisha Padattil Kuliyampattil, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 70 days.

(21) Appl. No.: 11/608,253

(22) Filed: Dec. 8, 2006

(65) Prior Publication Data

US 2008/0137388 A1      Jun. 12, 2008

(51) Int. Cl.
*G11C 15/00*      (2006.01)
(52) U.S. Cl. .............. 365/49.1; 365/49.16; 365/49.17; 365/49.18
(58) Field of Classification Search ................ 365/49.1, 365/49.11, 49.12, 49.13, 49.15, 49.16, 49.17, 365/49.18, 50
See application file for complete search history.

(56) References Cited

U.S. PATENT DOCUMENTS

| | | | | |
|---|---|---|---|---|
| 6,065,091 A | * | 5/2000 | Green | 365/49.16 |
| 6,147,890 A | * | 11/2000 | Kawana et al. | 365/49.1 |
| 6,697,275 B1 | * | 2/2004 | Sywyk et al. | 365/49.17 |
| 7,170,769 B1 | * | 1/2007 | Sachan et al. | 365/49.15 |
| 7,203,082 B1 | * | 4/2007 | Bhatia et al. | 365/49.17 |
| 7,259,979 B2 | * | 8/2007 | Sachan et al. | 365/49.15 |
| 7,274,581 B1 | * | 9/2007 | Powell et al. | 365/49.16 |
| 7,277,308 B2 | * | 10/2007 | Sachan | 365/49.17 |

* cited by examiner

*Primary Examiner*—Trong Phan
(74) *Attorney, Agent, or Firm*—Alan K. Stewart; W. James Brady; Frederick J. Telecky, Jr.

(57) ABSTRACT

A novel match/mismatch emulation scheme for an addressed location in a CAM system that includes a plurality of CAM blocks. The plurality of CAM blocks are organized into at least one rectangular array having rows each having a plurality of CAM blocks, a group of CAM cells and associated read/write bit lines connecting the group of CAM cells to an addressed search circuit. During debug mode, where the individual array cells do not participate in search, all the cells in the debug column behave the same way to emulate a match/mismatch on all words. The circuit provides a control input to include address evaluation of a debug cell in a row. The circuit also provides simultaneous switching noise analysis on an evaluating row. The resulting CAM cell provides a circuit to test individual rows for defects and noise analysis.

6 Claims, 5 Drawing Sheets

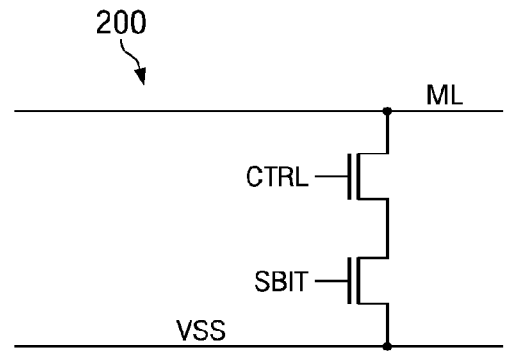
FIG. 2
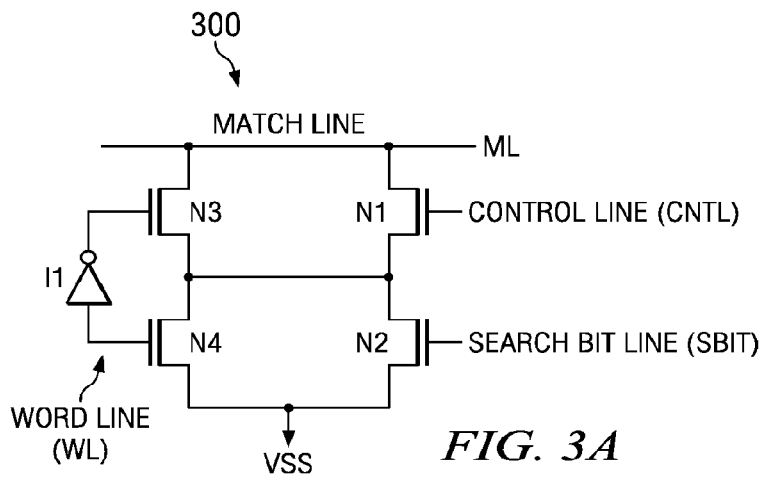
FIG. 3A
| SBIT | CNTL | WL | OPERATION |
|------|------|----|-----------|
| 1 | X | 0 | ALL ROWS MISMATCH |
| 0 | X | 0 | ALL ROWS MATCH |
| X | 1 | 1 | ADDRESSED ROW MISMATCH (ALL OTHER MATCH) |
| X | 0 | 1 | ADDRESSED ROW MATCH (ALL OTHER MISMATCH) |
FIG. 3B

600

| RST | DEBUG | RSTCNTL |
|---|---|---|
| 0 | 0 | 0 |
| 0 | 1 | 0 |
| 1 | 0 | 0 |
| 1 | 1 | 1 |

| DEBUG | MOCKMAT | DEBUGMATCH |
|---|---|---|
| 0 | 0 | 0 |
| 0 | 1 | 0 |
| 1 | 0 | 1 |
| 1 | 1 | 0 |

| RSTCNTL | DEBUG MATCH | SEARCH ENABLE | SBIT | CNTL |
|---|---|---|---|---|
| 0 | 0 | 1 | 0 | 0 |
| 0 | 1 | 1 | 1 | 0 |
| 1 | 0 | 1 | 1 | 0 |
| 1 | 1 | 1 | 0 | 1 |

MATCH MISMATCH EMULATION SCHEME FOR AN ADDRESSED LOCATION IN A CAM

TECHNICAL FIELD OF THE INVENTION

The present invention relates generally to digital integrated circuits, and more particularly relates to testing of content addressable memories (CAMs).

BACKGROUND OF THE INVENTION

Content Addressable Memories (CAMs) are commonly used in cache systems, and other address translation systems, of high speed computing systems. They are also useful in high-speed network routers, and many other applications known in the art of computing. CAMs can be Binary (logic states, zero and one) or Ternary (logic states zero, one and don't care).

A CAM system is composed of CAM blocks with arrays of CAM cells. A CAM system typically has a CAM block array (M×N) that includes a plurality of rows (M) and a plurality of columns (N). Further, each row has a plurality of CAM blocks, and each CAM block has a plurality of CAM cells. These arrays typically have vertically running bit lines and search lines for data read/write function and horizontal running word lines and match lines. All CAM cells in a column share the same bit lines and search lines, whereas the word lines and match lines are shared by all cells in a row. Each CAM cell includes a pair of memory elements and a corresponding pair of compare circuits.

The CAM cells are characterized by circuitry capable of generating a match output for each row of CAM blocks in the CAM cell thereby indicating whether any location of the array contains a data pattern that matches a query input and the identity of that location. Each CAM cell typically has the ability to store a unit of data, and the ability to compare that unit of data with a unit of query input and each CAM block has the ability to generate a match output. In parallel data search, an input keyword is placed at the search bit lines after precharging the match lines to a power supply voltage Vdd. The data in each CAM cell connected to a match line is compared with this data, and if there is a mismatch in any cell connected to a match line, the match line will discharge to ground through the compare circuit of that CAM cell. A compare result indication of each CAM block in a row is combined to produce a match signal for the row to indicate whether the row of CAM cells contains a stored word matching a query input. The match signals from each row in the CAM cell together constitute match output signals of the array; these signals may be encoded to generate the address of matched locations or used to select data from rows of additional memory.

Each CAM cell in each column is typically connected to a common read/write bit line pair and search bit line pair. The common read/write bit line is used to write the data to a pair of memory cells, which can be part of a CAM cell. Each memory cell is accessed using a word line which is decoded using an input address. The common read/write bit line is also used for reading the data from a memory cell. The differential developed across the read/write bit lines are sensed using a sense amplifier during a read cycle.

Further, each CAM cell in each column is typically connected to a common query data line, also referred to as a common search bit line. The common search bit line enables simultaneous data searching in each CAM cell in a column from a query input. The common search data line can also be used as a write data line, when the CAM cell is based on a PMOS compare circuit.

Each CAM cell in each column of a CAM array is typically connected to a common read/write bit line and a search bit line. The common read/write bit line is used to write the data to a pair of memory cells, which can be part of a ternary CAM (TCAM) cell or a single memory cell, such as a binary CAM. Each memory cell is accessed using a word line which is decoded using an input address. The common read/write bit line is also used for reading the data from a memory cell. The differential developed across the read/write bit lines are sensed using a sense amplifier during a read cycle.

Further, each CAM cell in each column in the CAM arrays is typically connected to a common query data line, also referred to as a common search data line. The common search data line enables simultaneous data searching in each CAM cell in a column from a query input. The common search data line can also be used as a write data line, when the CAM array is based on a PMOS compare circuit.

The unit of data that is stored in a TCAM cell is ternary, having three possible states: logic one, logic zero, and don't care. To store these three states, two memory elements are needed. TCAM blocks of these TCAM cells produce a local match compare result if the query input is equal to the data stored in the CAM cells in the TCAM blocks, the query input contains a don't care state, or the data stored is a don't care data. The TCAM cells produce a mismatch result otherwise. The TCAM cells are particularly useful in address translation systems that allow variable sized allocation units.

During normal operation of a CAM, whenever data is searched, the contents of each cell is checked in a column, and if there is a match or mismatch, the entire row is searched, and if the full row is matching a match condition exists. Typically, in a CAM array, during debug mode, the individual cells do not participate in search. However, all the cells in the debug column would behave the same way to emulate a match or mismatch, (depending on the control input), on all words. Conventionally, at a given time, search is performed only on one row of a CAM array, and there is no easy way to test individual rows (words) for defects or exercise the effect of simultaneous switched noise on an evaluating row.

SUMMARY OF THE INVENTION

According to an aspect of the subject matter, there is provided a technique for emulating the match/mismatch emulation at an addressed location in a CAM, irrespective of whatever data is present on the row. The apparatus includes a write/search bitline decoder and driver circuit, a CAM cell array including multiple CAM cells. The CAM cell array is organized into at least one rectangular array having rows each having a plurality of CAM cells, and each CAM cell is associated with a row and a column of the CAM cell array, and further associated with a row and a column in a CAM block. Each CAM cell includes an associated read/write bit line coupled between each CAM cell and the write/search bitline decoder and driver circuit. During a write cycle the write bit line decoder and driver circuit writes a data bit to each CAM cell via an associated read/write bit line. An associated addressed search circuit during debug mode, allows the CAM to emulate a single row match/mismatch.

BRIEF DESCRIPTION OF THE DRAWINGS

FIG. 2 is a circuit diagram of a conventional debug circuit in a CAM array.

FIG. 3A is a circuit diagram of the addressed search circuit.

FIG. 3B is the corresponding truth table representation of the addressed search circuit as shown in FIG. 3A for all conditions on the WL (word line of corresponding row), SBIT (search bit line of search debug circuit column) and CNTL (control signal for addressed debug search mode) signals.

FIGS. 6A, 6B and 6C are truth tables for control signal generation circuit.

DETAILED DESCRIPTION OF THE INVENTION

In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1A:
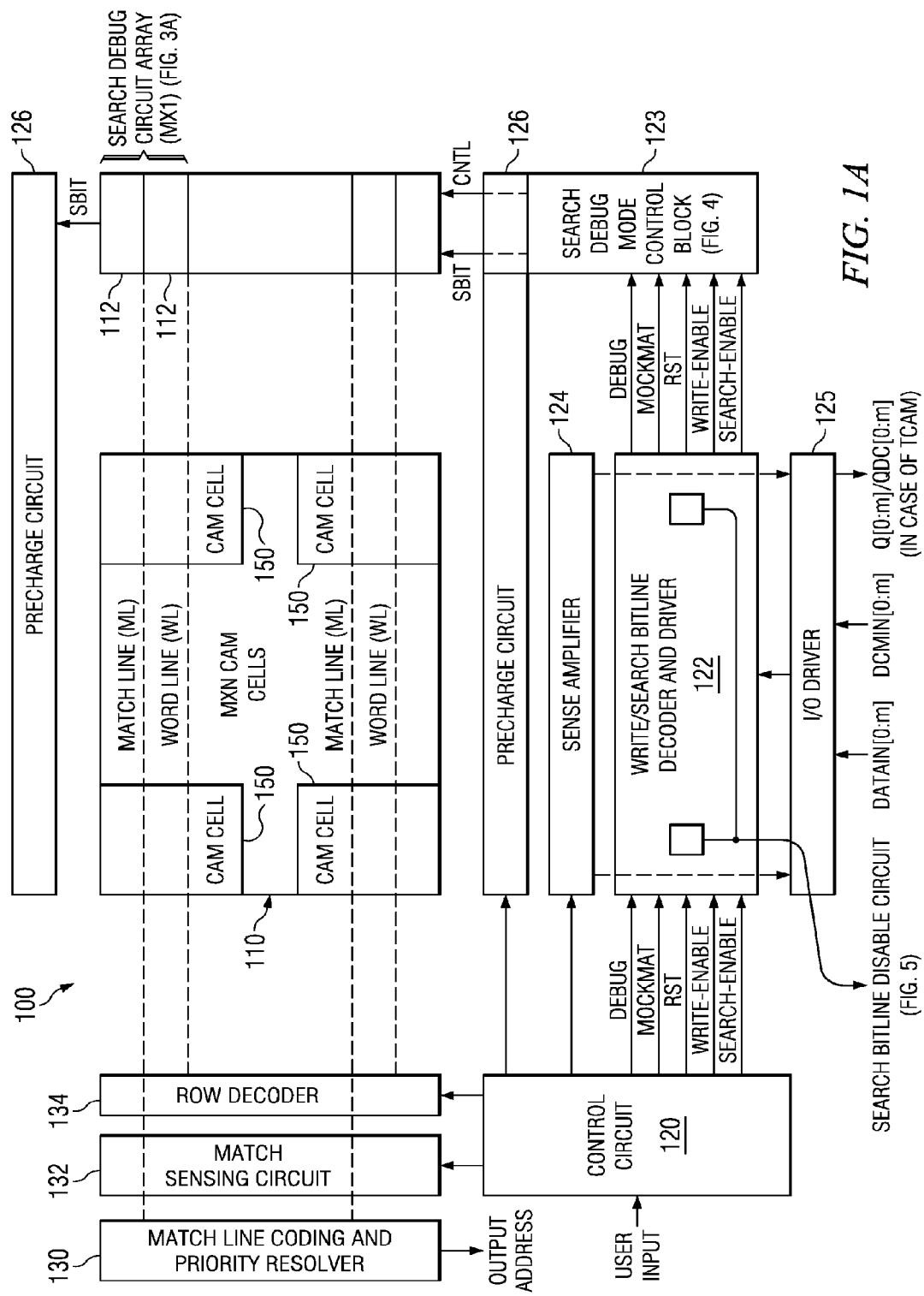
FIG. 1A is a block diagram of a CAM system according to an embodiment of the present invention.

Referring now to FIG. 1A, there is illustrated an embodiment of a CAM system 100 according to the present invention. The CAM system 100 includes a CAM cell array 110, a control circuit 120, write/search bitline decoder and driver circuit 122, sense amplifier 124, read/write bit line and search bitline precharge circuit 126 and input/output (I/O) drivers 125. As shown in FIG. 1, the CAM system 100 further includes a match line encoding and priority resolver 130, a match sensing circuit 132, and a row decoder 134.

Figure 1B:
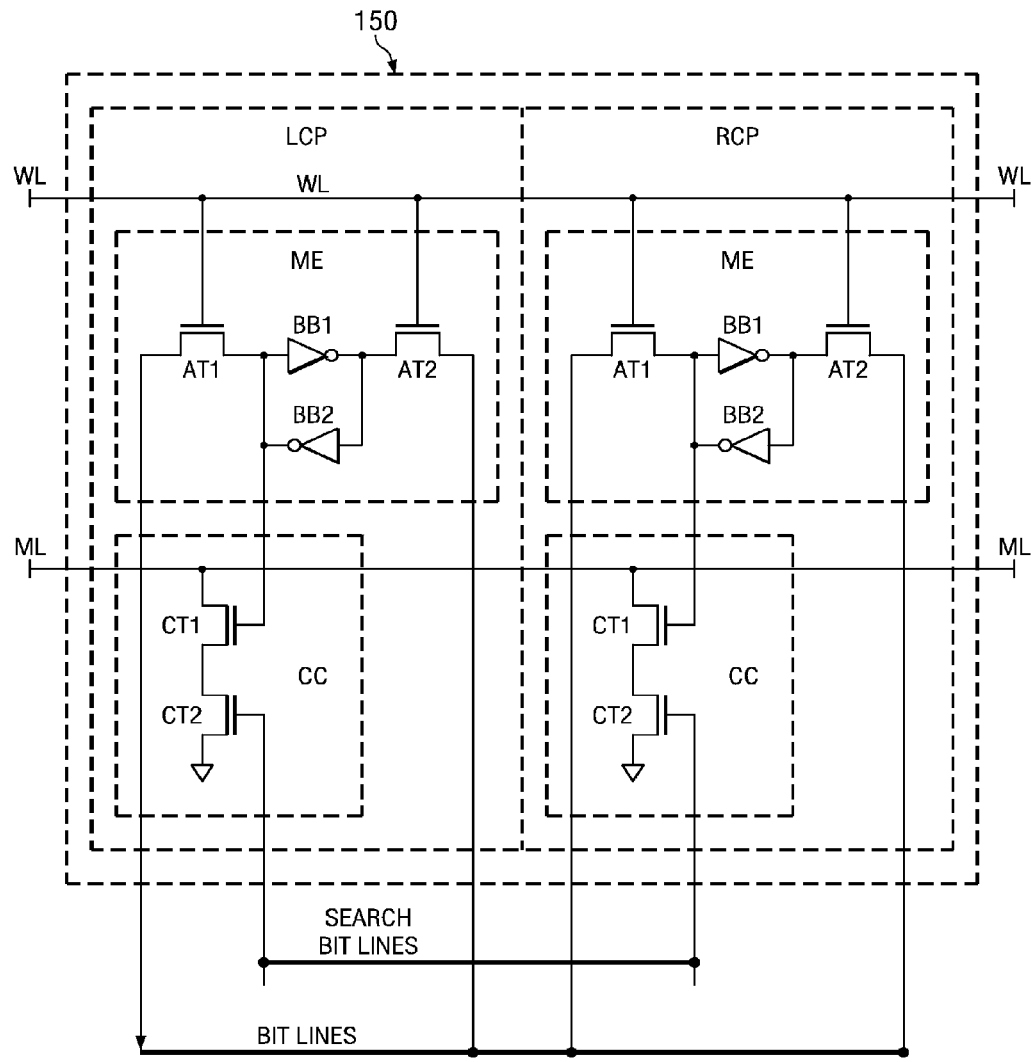
FIG. 1B is a circuit diagram of a representative CAM cell (a TCAM cell) as shown in FIG. 1A.

Further as shown in FIG. 1A, the CAM cell array 110 has multiple CAM cells 150 which are organized into at least one rectangular array which has a plurality of rows, and each row has a plurality of CAM cells. In some embodiments, the CAM cell array 110 is arranged to include (M×N) CAM cells which has M number of rows and N number of columns. As shown in FIG. 1, each of the plurality of CAM cells has an associated match line (ML) and a word line (WL). The CAM cell 150 of the CAM cell array 110 can be a binary CAM cell or a TCAM cell. A representative CAM cell (TCAM cell) is shown as in FIG. 1B. A control circuit 120 receives user input and is in communication with the precharge circuit 126, sense amplifier 124, write/search bitline decoder and driver circuit 122, and I/O driver 125. An I/O driver 125 is in communication with the control circuit 120 and the write/search bitline decoder and driver circuit 122. The I/O driver 125 receives the external input signals DATAIN [0:m] and DCMIN [0:m] in search and write operations and sends output signals Q [0:m] and QDC [0:m] in read operation where m is the number of data bits. The I/O driver 125 receives the external input signals DATAIN [0:m] and DCMIN [0:m] and sends output signals Q [0:m] and QDC [0:m] where m is the number of data bits. The associated read/write bit lines and the corresponding read/write bit complement lines (shown in FIG. 1B) are coupled to the one or more precharge circuits 126, the sense amplifier 124, and the write/search bitline decoder and driver circuit 122 (shown in FIG. 1A). The DATAIN is a user sent input data sent to compare stored data. The DCMIN is a user data compare input. For example, if DCM is high then the input value is considered as a don't care input and value at DATAIN is not compared. The Q and QDC outputs are the read output signals from the I/O driver 125.

Figure 4:
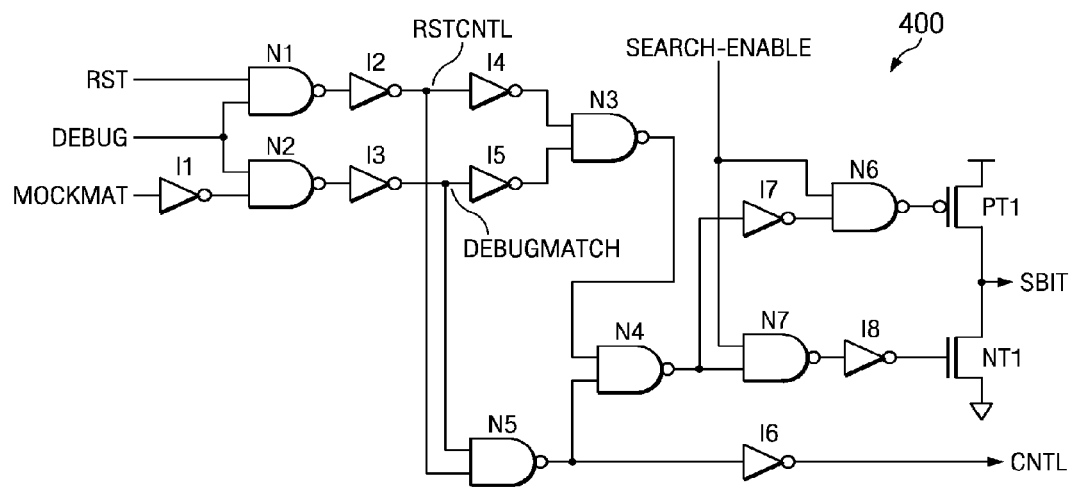
FIG. 4 is a schematic diagram of SBIT and CNTL generational circuit along with the RSTCNTL and DEBUGMATCH intermediate control signal generation.

The write/search bitline decoder and driver circuit 122 receives the input signals DEBUG, MOCKMAT, RST, WRITE-ENABLE AND SEARCH-ENABLE from the control circuit 120. The output signals coming from the control block are inputs to the search debug mode control block 123 as shown in FIG. 1A. The search debug control block 123 is in communication with the search debug circuit array 112, which is represented by FIG. 4 via the SBIT and CNTL signals. Further, the I/O driver 125 receives the external input signals DATAIN [0:m] and DCMIN [0:m] and output signals Q [0:m], and QDC [0:m] (in the case of a TCAM). The DATAIN is a user sent input data sent to compare stored data Referring now to FIG. 1B, there is illustrated an embodiment of a circuit diagram of the left and right circuit portions of a TCAM cell 150 used in the CAM cell array 110 (shown in FIG. 1A). As shown in FIG. 1B, the TCAM cell 150 (representative CAM cell 150 of FIG. 1A) has a left circuit portion LCP and a right circuit portions RCP, and includes a pair of memory elements ME for each of the left and right circuit portions LCP and RCP respectively. The associated NMOS based pair of compare circuits CC for each of the left and right circuit portions LCP and RCP respectively is also shown in FIG. 1B. The present invention is not limited to a TCAM cell based CAM block arrays and can be based on any other type of CAM cell, such as a binary CAM cells. In a binary CAM cell embodiments, the CAM cell stores one data bit, whereas a TCAM cell 150, such as the one shown in FIG. 1B, includes two memory elements, such as SRAM cells and can store two data bits. The TCAM cells have the capability to store and search "don't cares" as well.

As shown in FIG. 1B, each of the left and right circuit portions LCP and RCP of the TCAM cell 150 includes two back-to-back inverters BB1 and BB2 for each of the left and right circuit portions LCP, and RCP. As shown in FIG. 1B, the back-to-back inverters BB1 and BB2 are connected between a first access transistor AT1 and a second access transistor AT2. In the embodiment shown in FIG. 1B, the first access transistor AT1 and the second access transistor AT2 are NMOS based transistors. These back-to-back inverters BB1 and BB2 can be accessed via gates of the pair of NMOS transistors AT1 and AT2 and word line WL. Each of the left LCP and right circuit portions RCP of the TCAM cell 150 includes a match line ML, and a word line WL. Further included are a separate pair of read/write bit lines and their corresponding complements, referenced collectively as BIT LINES. Also, these back-to-back inverters BB1 and BB2 can be accessed via drains of the pair of NMOS access transistors AT1 and AT2 and the corresponding read/write bit and read/write bit complement lines. The gate of compare transistor CT2 of each of the left LCP and right circuit portions RCP is respectively connected to the search bit lines referenced as SEARCH BIT LINES, which is shown as SBIT in FIG. 1A.

Further, as shown in FIG. 1B, the NMOS based pair of compare circuits CC includes a first compare NMOS transistor CT1 and a second compare NMOS transistor CT2 in each of the left and right circuit portions LCP and RCP. As shown, the compare transistors CT1 of the left and right circuit portions are connected to match line ML. In case of a mismatch, the match line will be pulled low. Also it can be seen in FIG. 1B, that the NMOS based pair of compare circuits CC is connected to the search bit lines and its complement. The search bit line is connected to the gate of compare transistor CT2 of the left circuit portion LCP of the TCAM cell 150, whereas the search bit complement line is connected to the gate of compare transistor CT2 of the right circuit portion RCP of the TCAM cell 150.

Referring now to FIG. 2, there is illustrated the conventional debug circuit for a CAM array. The debut circuit consists of 2 NMOS transistors, with the gates connected to the control input CTRL, and search bit input SBIT, where SBIT and CTRL are internal controls. The source terminal of SBIT and drain terminal of CTRL inputs are connected to each other, whereas the source of the CTRL and the drain of the SBIT are connected respectively to the MATCH LINE ML input and the ground terminal VSS input. ML is a match line that runs the same as in the CAM array. In a typical operation, the array compares are shut off by turning off the SBITs of all columns in the array, so a single mismatch can be tested. When the CTRL signal is on, the test bit is ready to evaluate based on SBIT. To emulate a mismatch, the SBIT signal is driven high. The debug mode is useful in emulating single mismatch timing with CRTL is driven high. In this mode, when SBIT and CTRL bit are both high, there is no decoding, and all rows are in mismatch condition. When SBIT and CTRL bits are both at logic 0, all rows are in match condition.

Referring now to FIG. 3A, there is illustrated a circuit diagram of an addressed search debug circuit 300 of the present invention. As shown in FIG. 3A, the addressed search debug circuit 300 includes 4 NMOS transistors and one inverter.

The addressed search circuit as shown, consists of 3 control pins, one normal word line WL which is asserted in read and write operation in normal mode and also asserted in search operation in debug mode, the control pin CNTL and the search bitline SBIT. In normal search mode, WL is not asserted. In address search debug mode, the SBIT becomes low, the control input CNTL becomes high, the WL of one row, whichever row is addressed will become high, and the address match line (ML) is mismatched and all other match lines (MLs) will show a match. These MLs are precharged to a high state and result in a mismatch when pulled down.

As shown in FIG. 3A, the addressed search circuit 300 includes a first NMOS transistor N1, a second NMOS transistor N2, a third NMOS transistor N3, a fourth NMOS transistor N4 and a first inverter I1. Further as shown in FIG. 3, the internal control inputs CNTL and SBIT are connected to the gates of the transistors N1 and N2 respectively. The word line signal WL is connected to the gate of N4 and the inverted signal of WL is connected to the gate of the third NAND gate N3. The drain terminals of N2 and N1 are interconnected to the drain terminals of N4 and N3. The source terminals of N2 and N4 are connected to the VSS input and the source terminals of N1 and N3 are connected to the match line ML. The operation of this circuit is shown in a truth table format, as shown in FIG. 3B adjacent to the circuit diagram in FIG. 3A.

In debug operation, the addressed search circuit 300 described above receives the internal control signals CNTL and SBIT. For example, if SBIT=1, CNTL=X, a don't care condition, and WL=0, the conditions on all rows is a mismatch. The other conditions are achieved by the addressed search circuit as follows:

SBIT=0, CNTL=X, WL=0, All Rows match.
SBIT=X, CNTL=1, WL=1, Addressed Row Mismatch, (all other rows match).
SBIT=X, CNTL=0, WL=1, Addressed Row Match, (all other rows mismatch).

Referring now to FIG. 4, there is illustrated the circuits of RSTCNTL and DEBUGMATCH control signal generation 400, which further generates the SBIT and CNTL control signals. The circuit consists of a first NAND gate N1 whose inputs are reset signal RST and debug signal DEBUG, a first inverter T1 whose input is MOCKMAT, and the output is the inversion of MOCKMAT, a second NAND gate N2, whose inputs are the inverted output of MOCKMAT and DEBUG, a second inverter I2, whose input is the output of N1 and the output is RSTCNTL, a third inverter I3, whose input is the output of N2 and the output DEBUGMATCH signal.

Now referring to the circuits of SBIT and CNTL control signal generation, the circuit consists of a 2 input NAND gate N5, whose inputs are RSTCNTL and DEBUGMATCH, the output of N5 is connected to an inverter I6 whose output is the control input CNTL.

The signals RSTCNTL and DEBUGMATCH are inverted via the inverters I4 and I5 respectively and are connected to two inputs of a NAND gate N3, the output of N3 connected to a 2 input NAND gate, N4. The second input of N4 is connected to the output of N5 coming from the RSTCNTL and DEBUGMATCH signals. The output of N4 is connected to a 2 input NAND gate, N7. The SEARCH-ENABLE signal is connected to the second input of N7, as well as to a first input of a 2 input NAND gate N6. The output of N4 is connected to the second input of N7 and to an inverter I7, whose output is the second input of N6. The output of N7 is connected to an inverter I8. The outputs of N6 and I8 are connected to the gates of the P channel and N channel transistors PT1, and NT1 respectively. The source of PT1 is connected to a power supply source (VDD), and the source of NT1 is connected to a ground terminal (VSS), the output of the transistor is SBIT control signal. The conduction path of the transistor pair PT1/NT1 is controlled by the complementary signals SEARCH-ENABLE and its complement.

For address mismatch mode, the addressed row will be discharged, for all other rows it will not be discharged, and results as a match. In a normal search debug mode the word lines will always be low. There are three pins to control these 4 modes, in debug mode, when MOCKMAT is high, it will be a match, and if MOCKMAT is low, it will be a mismatch.

Figure 5:
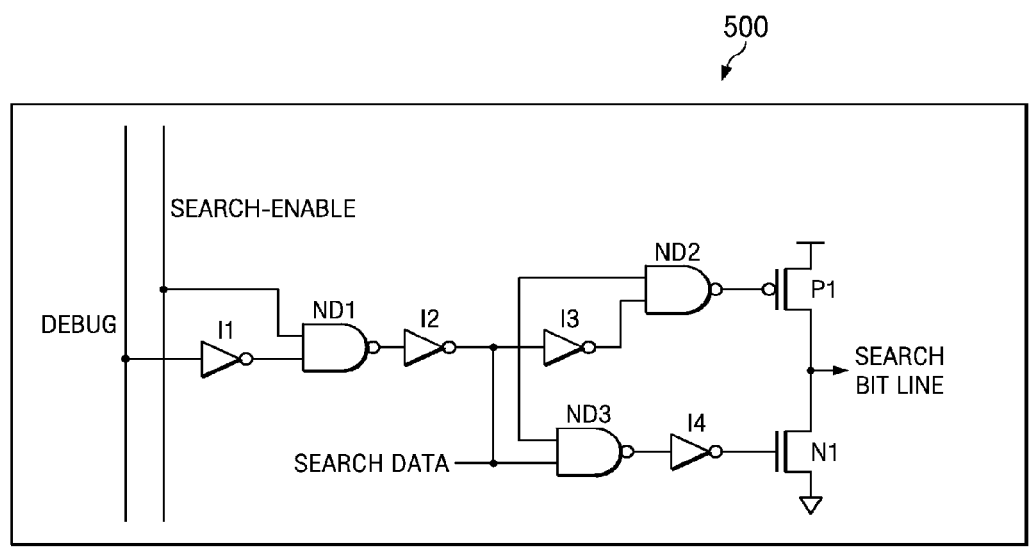
FIG. 5 is a schematic diagram of a normal search bit line disable circuit in debug mode.

Referring now to FIG. 5, there is illustrated a search bitline disable circuit 500 in search debug mode. As shown, the DEBUG signal is the input to an inverter I1, and the SEARCH-ENABLE signal is an input to a 2 input NAND gate ND1, with the other input coming from the inverter I1. The output of ND1 is inverted via the inverter I2, and this inverted signal is received by the search bit line generation block. The inverted signal from I2 and the search data signal are further inputted into NAND gates ND2 and ND3 and inverters I3 and I4. The search bit line output is generated from this circuit at the output of the transistor pair P1 and N1 as shown. The search bitline disable circuit is shown in FIG. 1 as represented by a block (FIG. 5) in the write/search bitline decoder and driver circuit 122.

Referring now to FIGS. 6A to 6C, there is illustrated the truth tables 600 depicting the operation of the control signal generation circuits of FIGS. 4A and 4B. In operation, as shown in FIG. 6a, the control signal generation circuit 500 of FIG. 5, described above receives the external input signals RST, DEBUG, RSTCNTL. When RST=1 and DEBUG=1, the input RSTCNTL=1. For all other conditions of RST and DEBUG, the input RSTCNTL=0.

FIG. 6b shows the operation of the MOCKMAT and DEBUG signals. When DEBUG=1, and MOCKMAT=0, DEBUGMATCH=1, for all other conditions DEBUGMATCH=0.

FIG. 6C shows the operation of the SBIT and CNTL output signals. When SEARCH ENABLE=1, RSTCNTL=0, DEBUGMATCH=0, SBIT=0, CNTL=0. The other conditions being:
SEARCH ENABLE=1, RSTCNTL=0, DEBUGMATCH=1, SBIT=1, CNTL=0.
SEARCH ENABLE=1, RSTCNTL=1, DEBUGMATCH=0, SBIT=1, CNTL=0.
SEARCH ENABLE=1, RSTCNTL=1, DEBUGMATCH=1, SBIT=0, CNTL=1.

The above-described methods and apparatus provide a scheme to emulate a match/mismatch condition at an addressed location in a CAM. This scheme is particularly useful in test chips, if there is a fault on a match line, a match or mismatch on a particular row may be evaluated. In a conventional system, where each location has to be written one location at a time, then a full row write, followed by a search can be tedious. The invention provides the circuit to track faults quickly.

Although FIGS. 2-6, are illustrative of only one embodiment, it can be envisioned that there are other embodiments. Although the invention described here applies to a conventional CAM cell, it applies to any kind of CAM cell, for example a CAM in a lateral or stacked arrangement. As can be seen the above described method provides a fault testing capability for CAMs. The above-described method also provides application specific uses in routers and networking products.

The above-described methods and apparatus provide various schemes to provide match/mismatch evaluation on individual rows and thereby testability and exhaustive fault coverage for CAM cells. The inventive features of the addressed search circuit incorporating the control pins can be implemented in any kind of CAM cells. While the present subject matter has been described with reference to static memory elements, it is can be used in dynamic CAM cells also. The proposed technique increases performance and testability of CAM arrays.

It is to be understood that the above description is intended to be illustrative, and not restrictive. Many other embodiments will be apparent to those of skill in the art upon reviewing the above description. The scope of the subject matter should, therefore, be determined with reference to the following claims, along with the full scope of equivalents to which such claims are entitled.

The invention is a novel scheme for match/mismatch emulation for an addressed location in a CAM by providing an addressed search circuit. The addressed search circuit of the CAM cell provides an extra control input, to provide addressable evaluation of a debug cell in a row. The resulting CAM cell provides exhaustive fault testing for detecting and eliminating faults in CAMS. The invention also provides cost savings in the area of testability of CAMS since testing costs of CAMS are high due to the unique configuration and complexity of CAM system design. Further, the addressed match line output can be used to control downstream logic/RAM controllability. The circuit also provides tests of address decoder during search and word line WL faults, and tests a single mismatch in a noisy environment, and allows margin tests for single mismatch in any row versus dummy tracking match.

As shown herein, the present invention can be implemented in a number of different embodiments, including various methods, an apparatus, and a system. Other embodiments will be readily apparent to those of ordinary skill in the art. The elements, algorithms, and sequence of operations can all be varied to suit particular requirements.

FIGS. 1-6a, 6b and 6c are merely representational and are not drawn to scale. Certain proportions thereof may be exaggerated, while others may be minimized. FIGS. 1-6a, 6b, 6c illustrate various embodiments of the invention that can be understood and appropriately carried out by those of ordinary skill in the art.

It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of the embodiments of the invention, with each claim standing on its own as a separate preferred embodiment.

The above description is intended to be illustrative, and not restrictive. Many other embodiments will be apparent to those skilled in the art. The scope of the invention should therefore be determined by the appended claims, along with the full scope of equivalents to which such claims are entitled.

The invention claimed is:

1. A content addressable memory (CAM) system comprising:
   a write/search bit line decoder and driver circuit having a word line and a match line; and
   a CAM cell array, wherein the CAM cell array is organized into at least one rectangular array having rows and columns of CAM cells, and wherein said each one of the CAM cells comprise:
      an associated read/write bit line coupled between said each one of the CAM cells and the write/search bit line decoder and driver circuit, and wherein during a write cycle, the write/search bit line decoder and driver circuit writes a data bit to said each one of the CAM cells via the associated read/write bit line; and
      an associated addressed search circuit having:
         a first pair of N channel transistors, wherein the gates of the N channel transistors are coupled to a search bit line and a control line respectively;
         a second pair of N channel transistors coupled to the word line and the match line, wherein during a debug mode the associated addressed search circuit receives data from the control bit line and the search bit line, and determines whether there is a match/mismatch on an addressed row.

2. The system of claim 1, further comprising:
   a sense amplifier; and
   a pair of precharge circuits, wherein said each one of the CAM cells is coupled to the sense amplifier and the pair of precharge circuits via the associated read/write bit line, wherein during a read cycle the sense amplifier to read a stored data bit in said each one of the CAM cells via the associated read/write bit line, and wherein during a precharge cycle, the pair of precharge circuits to charge each read/write bit line substantially after completing the read cycle.

3. The system of claim 2, further comprising:
   an input/output (I/O) driver; and as associated read/write complement bit line coupled between said each one of the CAM cells and the write/search bit line decoder and driver circuit, wherein during the read cycle, the I/O driver reads a stored data bit and a stored complement data bit in said each one of the CAM cells via the associated read/write complement bit line and during the write cycle, the I/O driver writes a data bit to said each one of the CAM cells via the associated read/write complement bit line, wherein during the precharge cycle, the write/search bitline decoder and driver circuit to precharge each associated read/write complement bit line substantially after completing the write cycle, and wherein the pair of precharge circuits to precharge the read/write bit lines substantially after completing a read/write cycle.

4. The system of claim 3, further comprising:

a search bit line and a search bit complement line that are connected between said each one of the CAM cells and the write/search bit line decoder and driver circuit, and during the precharge cycle, the write/search bitline decoder and driver circuit to drive each search bit line and search bit complement line.

5. The system of claim 4, wherein the write bit line driver and decoder circuit comprises:

a data decode circuit for receiving input signals form the I/O driver during normal mode;

a search bitline disable circuit to bypass decoding the input signals from the I/O driver during debug mode and deep search bitlines in a previous predischarged state;

a write bit line driver circuit associated with each read/write bit line and each complement read/write line of one of said each one of the CAM cells coupled between the data decode circuit and the associated read/write bit line and the complement read/write line.

6. The system of claim 5, wherein the search bitline disable circuit comprises:

a first inverter;

a nand gate having a first input, second input and an output, wherein the first input of the nand gate is coupled to receive a SEARCH-ENABLE signal, and wherein the second input is coupled to receive an output of the first inverter, wherein the output of the nand gate is an input to a second inverter, wherein an output from the second inverter is coupled to a search bit line generation block, wherein the output of the search bit line generation block is the search bit line.

* * * * *